US009291666B2

(12) United States Patent
Ueno et al.

(10) Patent No.: US 9,291,666 B2
(45) Date of Patent: Mar. 22, 2016

(54) DETECTING DEVICE AND CURRENT SENSOR

(75) Inventors: Hiroshi Ueno, Aichi (JP); Kenji Kanemaru, Aichi (JP); Daisuke Mori, Aichi (JP); Francois Piette, Ieper (BE); Wouter Leten, Ieper (BE)

(73) Assignees: KABUSHIKI KAISHA TOKAI RIKA DENKI SEISAKUSHO, Aichi (JP); MELEXIS NV, Ypres (BE)

( * ) Notice: Subject to any disclaimer, the term of this patent is extended or adjusted under 35 U.S.C. 154(b) by 136 days.

(21) Appl. No.: 14/118,759

(22) PCT Filed: May 29, 2012

(86) PCT No.: PCT/JP2012/003508
§ 371 (c)(1),
(2), (4) Date: Dec. 26, 2013

(87) PCT Pub. No.: WO2012/064915
PCT Pub. Date: Dec. 6, 2012

(65) Prior Publication Data
US 2014/0159756 A1 Jun. 12, 2014

(30) Foreign Application Priority Data
May 30, 2011 (JP) ................................. 2011-120195

(51) Int. Cl.
G01R 31/28 (2006.01)
G01R 15/20 (2006.01)
G01R 33/07 (2006.01)
G01R 33/09 (2006.01)

(52) U.S. Cl.
CPC .......... G01R 31/2829 (2013.01); G01R 15/202 (2013.01); G01R 33/072 (2013.01); G01R 33/091 (2013.01)

(58) Field of Classification Search
CPC .. G01R 31/28; G01R 15/202; G01R 31/2829; G01R 33/072; G01R 33/091; G01R 33/07; G01R 15/20; G01R 33/09; G01R 35/00; H01L 43/08

USPC ...................................................... 324/750.01
See application file for complete search history.

(56) References Cited

U.S. PATENT DOCUMENTS 4,733,177 A * 3/1988 Pawletko ................. 324/207.21
6,028,335 A * 2/2000 Okamoto et al. ............. 257/314
(Continued)

FOREIGN PATENT DOCUMENTS

DE 102009034595 A1 * 4/2011 ............. G01R 19/00
JP 06-026968 A 2/1994
(Continued)

OTHER PUBLICATIONS

DE102009034595(A1), Apr. 21, 2011 Patent Translate, "Method for Diagnosing Current Sensors in an Induction Machine During Operation Thereof", G01R19/00.*
(Continued)

Primary Examiner — Melissa Koval
Assistant Examiner — Rahul Maini
(74) Attorney, Agent, or Firm — Roberts Mlotkowski Safran & Cole, PC

(57) ABSTRACT

A detecting device includes a detecting part configured to detect a change in an object to be detected so as to output a detection signal, an amplifying part configured to amplify the detection signal output from the detecting part to output a first amplification signal, a reference voltage supply part configured to supply a reference voltage to the amplifying part, the reference voltage being input to the amplifying part to be output as a second amplification signal, a switching part configured to switch a connection between the detecting part and the amplifying part or a connection between the amplifying part and the reference voltage supply part based on a control signal input thereto, and a comparing part configured to compare a predetermined amplification factor in the amplifying part, with an amplification factor obtained from the second amplification signal so as to output the comparison result as a comparison signal.

12 Claims, 4 Drawing Sheets

(56) References Cited

U.S. PATENT DOCUMENTS

| | | | | |
|---|---|---|---|---|
| 6,703,132 | B1* | 3/2004 | Yasuda et al. | 428/447 |
| 7,271,595 | B2* | 9/2007 | Shimizu | G01L 25/00 |
| | | | | 324/522 |
| 8,283,919 | B2* | 10/2012 | Yano | 324/247 |
| 8,760,168 | B2* | 6/2014 | Kudo | G01R 19/0084 |
| | | | | 320/116 |
| 2004/0174170 | A1 | 9/2004 | Kim | |
| 2006/0220745 | A1* | 10/2006 | Takekawa | H03F 3/68 |
| | | | | 330/306 |
| 2007/0013333 | A1* | 1/2007 | Ajima | H02P 6/18 |
| | | | | 318/432 |
| 2008/0030191 | A1* | 2/2008 | Nishikawa | 324/252 |
| 2010/0045272 | A1* | 2/2010 | Kondo | G01D 5/145 |
| | | | | 324/207.13 |
| 2012/0026287 | A1* | 2/2012 | Tsukagoshi | H04N 13/0029 |
| | | | | 348/43 |
| 2014/0375780 | A1* | 12/2014 | Tsukagoshi | H04N 13/0029 |
| | | | | 348/51 |

FOREIGN PATENT DOCUMENTS

| | | |
|---|---|---|
| JP | 2002-286667 | 3/2002 |
| JP | 2004-274987 | 9/2004 |
| JP | 2007-028793 A | 2/2007 |
| JP | 2008-032431 A | 2/2008 |
| JP | 2009-121934 A | 6/2009 |
| JP | 2010-133737 | 6/2010 |
| JP | 2010-181211 A | 8/2010 |

OTHER PUBLICATIONS

Office Action dated Dec. 24, 2014 and English translation of Reasons for Rejection X.

Notification concerning transmittal of Copy of International Preliminary Report on Patentability PCT/JP2012/003508.

Japanese Office Action dated Sep. 1, 2015 and partial English translation.

* cited by examiner

DETECTING DEVICE AND CURRENT SENSOR

TECHNICAL FIELD

This invention relates to a detecting device and a current sensor.

BACKGROUND ART

As a conventional technology, a current sensor device is known that includes a magnetic core configured to have a ring-like shape with voids and focus magnetic flux generated by a current to be measured that flows through an object to be measured inserted into a central part of the ring-like shape, a Hall element configured to be arranged in the voids of the magnetic core and output an electrical signal according to the magnetic flux, an inspection conductor configured to apply a predetermined magnetic flux generated by allowing a predetermined inspection current to flow therethrough to the Hall element, and an amplifier configured to amplify a Hall signal output from the Hall element (for example, refer to JP-A-2010-133737).

The current sensor device is capable of detecting a failure of the Hall element based on the Hall signal that is output from the Hall element and is amplified by the amplifier when the current to be measured does not flow through the object to be measured, and the inspection current is allowed to flow through the inspection conductor.

CITATION LIST

Patent Literature

PTL 1: JP-A-2010-133737

SUMMARY OF INVENTION

Technical Problem

However, since the conventional current sensor device is not able to check whether the Hall signal of the Hall element is amplified with a proper amplification factor or not, it has a problem that when the Hall signal predetermined is not output, it cannot judge whether the fact of the Hall signal not being output is caused by the failure of the Hall element or caused by that the amplification factor of the amplifier is different from a predetermined amplification factor.

Therefore, it is an object of the invention to provide a detecting device and a current sensor that are capable of judging whether an amplification factor is corresponding to a predetermined amplification factor so as to detect an abnormality in sensitivity.

The present application is based on Japanese patent application No. 2011-120195 filed on May 30, 2011, the entire contents of which are incorporated herein by reference.

Solution to Problem (1) According to one embodiment of the invention, a detecting device comprises:
a detecting part configured to detect a change in an object to be detected so as to output a detection signal;
an amplifying part configured to amplify the detection signal output from the detecting part so as to output a first amplification signal;
a reference voltage supply part configured to supply a reference voltage to the amplifying part, the reference voltage being input to the amplifying part so as to be output as a second amplification signal;
a switching part configured to switch a connection between the detecting part and the amplifying part or a connection between the amplifying part and the reference voltage supply part based on a control signal input thereto; and
a comparing part configured to compare a predetermined amplification factor in the amplifying part, with an amplification factor obtained from the second amplification signal so as to output the comparison result as a comparison signal.

In the above embodiment (1) of the invention, the following modifications and changes can be made.
(i) The detecting part comprises a magnetic sensor.
(ii) The magnetic sensor comprises a bridge circuit comprising a first magnetic sensor element to a fourth magnetic sensor element, and the reference voltage supply part generates a first reference voltage corresponding to a first divided voltage of the first magnetic sensor element and the second magnetic sensor element, and a second reference voltage corresponding to a second divided voltage of the third magnetic sensor element and the fourth magnetic sensor element in an initial state.
(iii) The comparing part is configured to compare a third amplification signal obtained by differentially amplifying the first divided voltage and the second divided voltage by the amplifying part, with a fourth amplification signal obtained by differentially amplifying the first divided voltage and the second reference voltage by the amplifying part so as to output the comparison signal.
(iv) The comparing part is configured to compare a third amplification signal obtained by differentially amplifying the first divided voltage and the second divided voltage by the amplifying part, with a fifth amplification signal obtained by differentially amplifying the first reference voltage and the second divided voltage by the amplifying part so as to output the comparison signal.

(2) According to another embodiment of the invention, a current sensor comprises:
the detecting device according to the above embodiment (1).

In the above embodiment (2) of the invention, the following modifications and changes can be made.
(v) The current sensor is connected to at least two phases of a three phase motor.

In the above embodiment (1) of the invention, the following modifications and changes can be further made.
(vi) The predetermined amplification factor is variable.
(vii) The detecting device further comprises:
a judging part configured to judge an abnormality of the detecting part and the amplifying part based on the comparison signal output from the comparing part.
(viii) The detecting part comprises an acceleration sensor configured to detect a change in an electrical capacity.

Advantageous Effects of Invention

According to one embodiment of the invention, a detecting device is configured to compare with an amplified voltage actually output an amplified voltage obtained by differentially amplifying a reference voltage V1 and a reference voltage V2 supplied from a reference voltage supply part. Thus, without being affected by the influence of an electromagnetic noise, it can output a comparison signal that shows whether the amplifying part functions normally or not.

BRIEF DESCRIPTION OF DRAWINGS

The preferred embodiments according to the invention will be explained below referring to the drawings, wherein.

DESCRIPTION OF EMBODIMENTS

Summary of Embodiments

The detecting device according to the embodiment includes a detecting part configured to detect a change in an object to be detected so as to output a detection signal, an amplifying part configured to amplify the detection signal output from the detecting part so as to output a first amplification signal, a reference voltage supply part configured to supply a reference voltage to the amplifying part, the reference voltage being input to the amplifying part so as to be output as a second amplification signal, a switching part configured to switch a connection between the detecting part and the amplifying part or a connection between the amplifying part and the reference voltage supply part based on a control signal input thereto, and a comparing part configured to compare a predetermined amplification factor in the amplifying part with an amplification factor obtained from the second amplification signal so as to output the comparison result as a comparison signal.

First Embodiment

<Configuration of Detecting Device>

Figure 1:
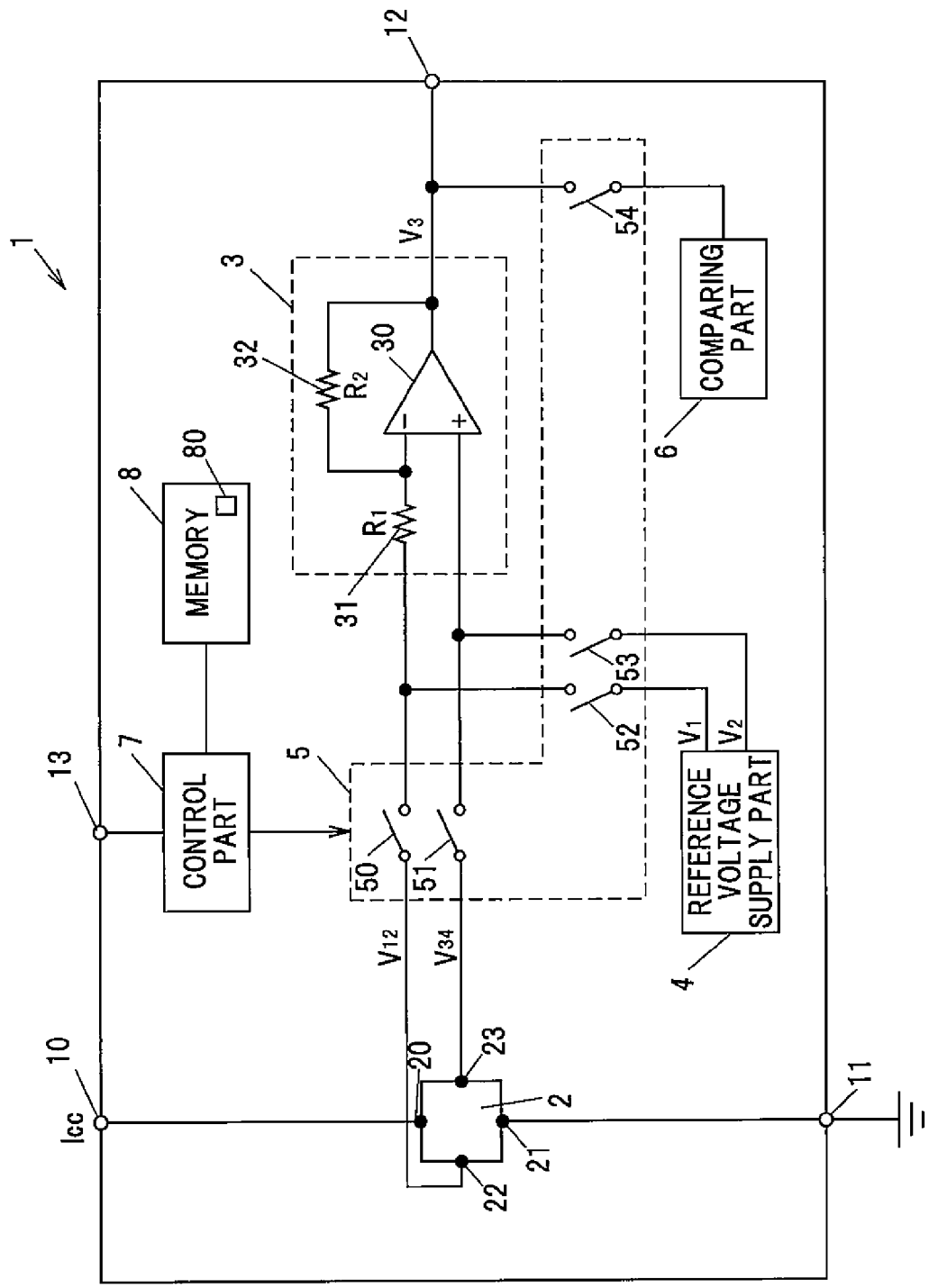
FIG. 1 is a block diagram schematically showing a detecting device according to a first embodiment of the invention.

FIG. 1 is a block diagram schematically showing a detecting device according to a first embodiment of the invention. The detecting device 1 is configured to, for example, judge whether an amplification factor is corresponding to a predetermined amplification factor or not so as to detect an abnormality in sensitivity. Further, hereinafter, a case that the detecting device 1 according to the embodiment is mounted on vehicles will be explained, but not limited to this case.

The detecting device 1 is roughly configured to mainly include a Hall sensor 2 as a detecting part configured to detect a change in an object to be detected so as to output a detection signal, an amplifying part 3 configured to amplify the detection signal output from the Hall sensor 2 so as to output a first amplification signal, a reference voltage supply part 4 configured to supply a reference voltage to the amplifying part 3, the reference voltage being input to the amplifying part 3 so as to be output as a second amplification signal, a switching part 5 configured to switch a connection between the Hall sensor 2 and the amplifying part 3 or a connection between the amplifying part 3 and the reference voltage supply part 4 based on a control signal input thereto, and a comparing part 6 configured to compare a predetermined amplification factor in the amplifying part 3 with an amplification factor obtained from the second amplification signal so as to output the comparison result as a comparison signal.

In addition, the detecting device 1 is configured to include, for example, a control part 7 and a memory 8. Furthermore, the detecting device 1 is configured to include, for example, two modes. The first mode is, for example, a mode configured to detect an abnormality in sensitivity from an amplification factor of the amplifying part 3. The second mode is, for example, a mode configured to amplify the output from the Hall sensor 2 so as to output it.

The Hall sensor 2 is a magnetic sensor using the Hall effect, for example, as shown in FIG. 1, it has four terminals 20 to 23. The Hall sensor 2 is configured to, for example, be driven with constant current, and output a change in voltage based on a magnetic field applied thereto. In addition, the Hall sensor 2 has, for example, a detection surface to which a magnetic field is applied. The Hall sensor 2 is configured, for example, such that a straight line connecting the centers of the terminal 20 and the terminal 21 is perpendicular to a straight line connecting the centers of the terminal 22 and the terminal 23, and a flat surface formed by the two straight lines configures the detection surface.

The terminal 20 is, for example, electrically connected to an input terminal 10, and a constant current $I_{cc}$ is supplied to the terminal 20. The terminal 21 is, for example, electrically connected to a GND terminal 11. The GND terminal 11 is, for example, connected to ground.

The terminal 22 is, for example, electrically connected to a switch 50. The terminal 23 is, for example, electrically connected to a switch 51.

The Hall sensor 2 is configured to, for example, output an electrical potential (divided voltage $V_{12}$) generated in a side of the terminal 22 and an electrical potential (divided voltage $V_{34}$) generated in a side of the terminal 23 due to a component perpendicular to the detection surface of the magnetic field applied to the detection surface, via the terminal 22 and the terminal 23. Further, in a case of a general Hall sensor, even in a state that a magnetic field is not applied or a magnetic field is too small to detect, an unbalanced voltage (an offset voltage) of not being zero is generated in the terminal 22 and the terminal 23, but the Hall sensor 2 according to the embodiment shall be configured such that the offset voltage becomes zero even in a state that a magnetic field is not applied or a magnetic field is too small to detect. Further, an initial state of the detecting device 1 means, for example, a state that a magnetic field is not applied to the Hall sensor 2 or a magnetic field is too small to detect, and an amplification signal obtained by differentially amplifying the divided voltage $V_{12}$ and the divided voltage $V_{34}$ becomes zero.

The amplifying part 3 is configured to include an operational amplifier 30, an input resistance 31 and feedback resistance 32. To an inverting input terminal (−) of the operational amplifier 30, for example, the input resistance 31 is electrically connected. In addition, to a non-inverting input terminal (+) of the operational amplifier 30, for example, a switch 51 and a switch 53 of the switching part 5 described below are electrically connected. The input resistance 31 has, for example, a resistance value of $R_1$. The feedback resistance 32 has, for example, a resistance value of $R_2$. Accordingly, an amplification factor of the amplifying part 3 is shown as $R_2/R_1$.

To the inverting input terminal (−) of the operational amplifier 30, for example, when the switch 50 of the switching part 5 is on-state, the divided voltage $V_{12}$ is input via the switch 50 and the input resistance 31. In addition, to the non-inverting input terminal (+) of the operational amplifier 30, for example, when the switch 51 of the switching part 5 is on-state, the divided voltage $V_{34}$ is input via the switch 51.

An output terminal of the operational amplifier 30 is electrically connected to, for example, the switch 54 of the switching part 5 and an output terminal 12.

The reference voltage supply part 4 is configured to, for example, generate a reference voltage $V_1$ as a first reference voltage and a reference voltage $V_2$ as a second reference voltage so as to supply to the amplifying part 3 via the switching part 5. The reference voltage supply part 4 is configured to, as one example, supply the reference voltage $V_1$ to a side of the inverting input terminal (−) of the operational amplifier 30, and the reference voltage $V_2$ to a side of the non-inverting input terminal (+) of the operational amplifier 30.

When the detecting device 1 is set to the first mode, the reference voltage supply part 4 is configured to, as one example, generate the reference voltage $V_1$ of 5 V and the reference voltage $V_2$ of 0 V.

The switching part 5 is configured to, for example, include the switches 50 to 54. The switching part 5 is configured to, for example, be able to be switched between an on-state and an off-state by a switch control signal output from the control part 7 described below.

The switch 50 is electrically connected to, for example, the terminal 22 of the Hall sensor 2 at one end thereof, and is electrically connected to the input resistance 31 of the amplifying part 3 and the switch 52 at another end thereof.

The switch 51 is electrically connected to, for example, the terminal 23 of the Hall sensor 2 at one end thereof, and is electrically connected to the non-inverting input terminal (+) of the operational amplifier 30 and the switch 53 at another end thereof.

The switch 52 is electrically connected, for example, between the switch 50 and the input resistance 31 at one end thereof, and is electrically connected to the reference voltage supply part 4 at another end thereof.

The switch 53 is electrically connected, for example, between the switch 51 and the inverting input terminal (−) of the operational amplifier 30 at one end thereof, and is electrically connected to the reference voltage supply part 4 at another end thereof.

The switch 54 is electrically connected, for example, between the output terminal of the operational amplifier 30 and the output terminal 12 of the detecting device 1 at one end thereof, and is electrically connected to the comparing part 6 at another end thereof.

The comparing part 6 is configured to, for example, be electrically connected to the output terminal of the amplifying part 3 via the switch 54 when the switch 54 of the switching part 5 is positioned at the on-state.

The comparing part 6 is configured to, as one example, in the first mode, compare an amplification voltage $V_3$ differentially amplified based on a reference voltage $V_1$ and a reference voltage $V_2$, and a predetermined amplification voltage obtained by being differentially amplified based on the reference voltage $V_1$ and the reference voltage $V_2$ with a predetermined amplification factor in the amplifying part 3.

In particular, the comparing part 6 is configured to, as one example, include an operational amplifier, and is configured such that the amplification voltage $V_3$ output from the amplifying part 3 is input to the inverting input terminal (−) of the operational amplifier, and the amplification voltage amplified with a predetermined amplification factor in the amplifying part 3 is input to the non-inverting input terminal (+) of the operational amplifier as a voltage to be compared. The comparing part 6 is configured to, for example, in the first mode, compare the above-mentioned two voltages so as to output a comparison signal indicating that the amplification factor is different in case that they do not coincide with each other.

The control part 7 is configured to, for example, control the switching part 5 based on a control signal input via a control terminal 13 and a switch information 80 stored in the memory 8. In addition, the control part 7 is configured to, for example, control the comparing part 6.

The memory 8 is configured to, for example, store the switch information 80. The switch information 80 is, for example, information for switching the switches 50 to 54 corresponding to the first mode and the second mode.

The control part 7 is configured to generate a switch control signal that in the first mode, allows the switches 50 and 51 to be the off-state, and allows the switches 52 to 54 to be the on-state, so as to output to the switching part 5. The control part 7 is configured to generate a switch control signal that in the second mode, allows the switches 50 and 51 to be the on-state, and allows the switches 52 to 54 to be the off-state, so as to output to the switching part 5.

The first mode is, for example, a mode that is executed by using an application of main power of vehicles as a trigger, and that outputs a comparison signal. The second mode is, for example, a mode that outputs the detection signal by the Hall sensor 2. Further, the application of main power of vehicles means, for example, putting an electronic device mounted on vehicles into a state of being operable.

<Operation of Detecting Device 1>

The operation of the detecting device 1 according to the embodiment will be explained below.

First, when a crew member applies the main power of vehicles, a control signal is input form the control terminal 13.

The control part 7 switches the switching part 5 in response to the first mode based on the control signal input, so as to allow the reference voltage supply part 4, the amplifying part 3 and the comparing part 6 to be electrically connected with each other.

In particular, the control part 7 obtains the switch information 80 from the memory 8 based on the control signal input from the control terminal 13, and generates the switch control signal corresponding to the first mode based on the switch information 80 obtained. Subsequently, the control part 7 outputs the switch control signal generated to the switching part 5. The switching part 5 allows the switches 50 and 51 to be the off-state, and allows the switches 52 to 54 to be the on-state based on the switch control signal.

Next, the reference voltage supply part 4 supplies the reference voltage $V_1$ and the reference voltage $V_2$ to the amplifying part 3.

Next, the amplifying part 3 outputs the amplification voltage $V_3$ obtained by differentially amplifying the reference voltage $V_1$ and the reference voltage $V_2$ input, to the comparing part 6 via the switch 54.

In particular, the amplifying part 3 differentially amplifies the reference voltage $V_1$ and the reference voltage $V_2$ with the amplification factor corresponding to the input resistance 31 and the feedback resistance 32.

Next, the comparing part 6 compares an amplification voltage obtained by differentially amplifying the reference voltage $V_1$ and the reference voltage $V_2$ with a predetermined amplification factor, to the amplification voltage $V_3$ actually output.

Next, the comparing part 6 outputs the comparison result as a comparison signal. Subsequently, if the control part 7 judges that the comparison signal has been output, the control part 7 switches the switching part 5 in response to the second mode so as to allow the Hall sensor 2 and the amplifying part 3 to be electrically connected with each other.

Here, for example, a detecting device including a Hall sensor and an amplifying part will be explained as Comparative Example. The amplifying part according to Comparative Example is able to amplify an input voltage with a predetermined amplification factor so as to output, when it functions normally. However, it is considered that even if the Hall sensor according to Comparative Example functions normally, the voltage output from the Hall sensor is affected by the influence of an electromagnetic noise and the like generated in vehicles. Namely, in case that an object to be detected is situated in a criteria condition, and the Hall sensor outputs a reference output that acts as a criterion, even if an actual amplification voltage obtained by amplifying the reference output corresponds to an amplification voltage obtained by amplifying the reference output with a predetermined amplification factor, it cannot be judged whether the detecting device according to Comparative Example functions normally or not, in other words it cannot be judged whether a failure or a sensitivity misalignment occurs or not, for the above-mentioned reason.

On the other hand, the detecting device 1 according to the embodiment compares an amplification voltage obtained by differentially amplifying the reference voltage $V_1$ and the reference voltage $V_2$ supplied from the reference voltage supply part 4, instead of the output from the Hall sensor 2, and an amplification voltage amplified with a predetermined amplification factor, so that it can output a comparison signal that shows whether the amplifying part 3 amplifies with a normal amplification factor or not. For example, an Electronic Control Unit (ECU) of vehicles can determine whether the amplifying part 3 is normal or not based on the detection signal output from the detecting device 1.

Further, the detecting device 1 can detect, for example, an abnormality of the Hall sensor 2 after it is determined that the amplifying part 3 is normal. In particular, after it is shifted to the second mode, when the amplifying part 3 is determined that it is normal and the detecting device 1 is situated in an initial state, the switches 50, 51 and 54 are allowed to be the on-state, and the switches 52 and 53 are allowed to be the off-state. Subsequently, the comparing part 6 compares an amplification voltage obtained by differentially amplifying the divided voltage $V_{12}$ and the divided voltage $V_{34}$ output from the Hall sensor 2, and an amplification voltage amplified with a predetermined amplification factor. The Hall sensor 2 according to the embodiment is configured, in an initial state, such that the divided voltage $V_{12}$ and the divided voltage $V_{34}$ become zero, thus in a case that the amplification voltage $V_3$ is within an acceptable range centered on zero, the comparing part 6 outputs a comparison signal that shows a normality of the Hall sensor 2, and in a case other than the above-mentioned case, the comparing part 6 outputs a comparison signal that shows an abnormality of the Hall sensor 2.

Advantages of First Embodiment

In accordance with the detecting device 1 according to the first embodiment, it can be determined whether the amplification factor is a predetermined amplification factor or not, and can detect an abnormality in sensitivity. The detecting device 1 compares by using an amplification voltage obtained by differentially amplifying the reference voltage $V_1$ and the reference voltage $V_2$ supplied from the reference voltage supply part 4, thus it is less affected by the influence of an electromagnetic noise, and it can output a comparison signal that shows whether the amplifying part 3 functions normally or not in comparison with a case that an amplification voltage obtained by amplifying an output of the Hall sensor is used.

In addition, in accordance with the detecting device 1 according to the embodiment, it can output a comparison signal that shows whether the Hall sensor 2 functions normally or not after it is determined that the amplifying part 3 functions normally, thus it can output a comparison signal that more precisely shows whether the Hall sensor 2 functions normally or not, in comparison with a case that a detection of abnormality of the Hall sensor 2 is executed based on a signal obtained by amplifying the output of the Hall sensor 2 at the amplifying part without executing a detection of abnormality of the amplifying part.

Second Embodiment

The second embodiment is different from the first embodiment in using a magnetoresistance (MR) sensor 2a as a detecting part, and executing a detection of abnormality of the MR sensor 2a in addition to a detection of abnormality of the amplification factor of the amplifying part 3. Further, in the embodiment described below, to elements having the same configuration and function as those of the first embodiment, identical codes will be given without adding explanation.

Figure 2:
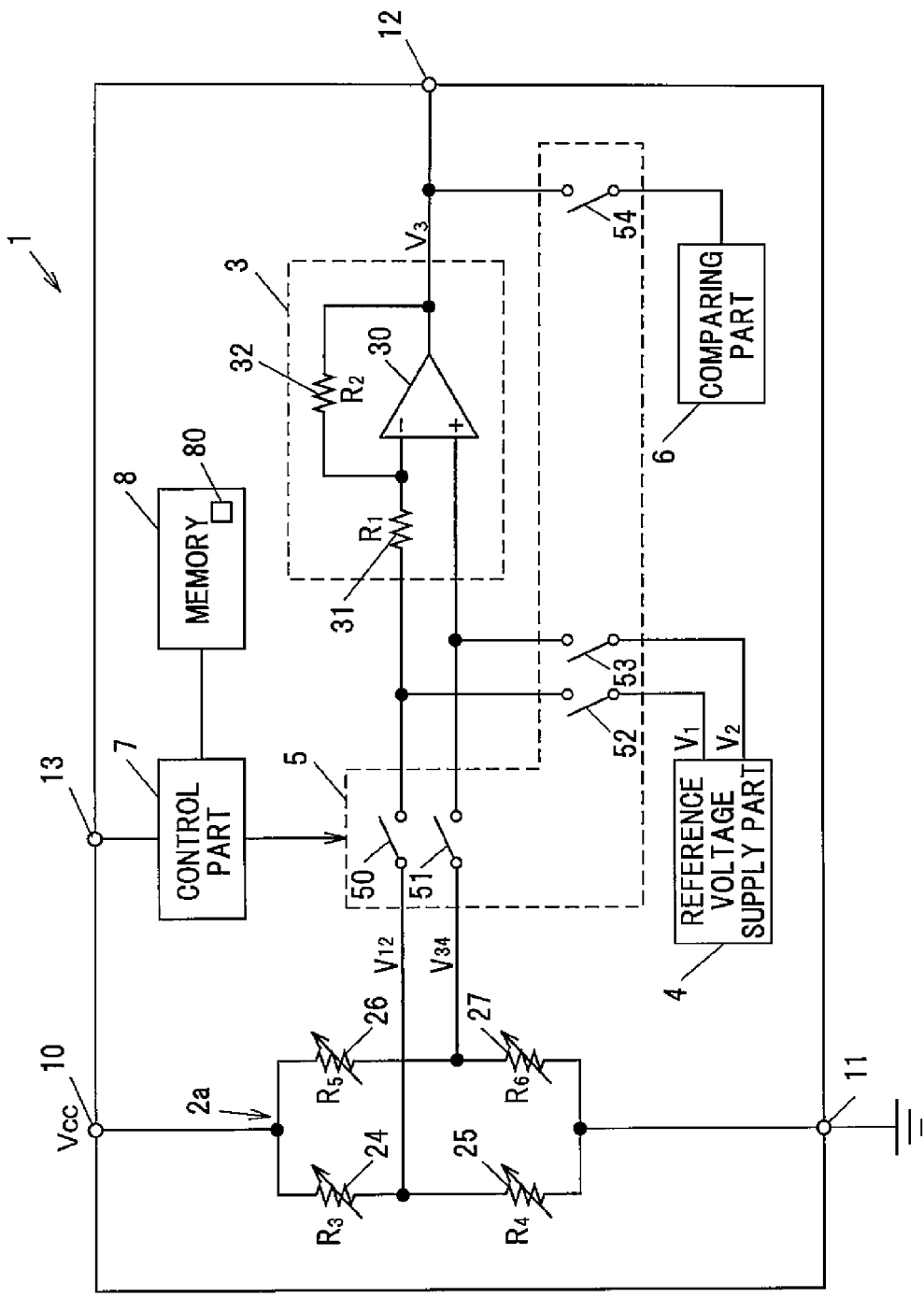
FIG. 2 is a block diagram schematically showing a detecting device according to a second embodiment of the invention.

FIG. 2 is a block diagram schematically showing a detecting device according to a second embodiment of the invention. The MR sensor 2a according to the embodiment is configured, for example, as shown in FIG. 2, such that a bridge circuit is formed by four magnetic sensor elements (magnetoresistance elements) 24 to 27.

The magnetoresistance element (first magnetic sensor element) 24 has, for example, a resistance value of $R_3$. The magnetoresistance element (second magnetic sensor element) 25 has, for example, a resistance value of $R_4$. One end of the magnetoresistance element 24 is electrically connected to one end of the magnetoresistance element 26, and simultaneously electrically connected to the input terminal 10. In addition, another end of the magnetoresistance element 24 is electrically connected to one end of the magnetoresistance element 25. Another end of the magnetoresistance element 25 is electrically connected to the GND terminal 11. Further, a voltage $V_{cc}$ is applied to the MR sensor 2a via the input terminal 10. The voltage $V_{cc}$ according to the embodiment is, as one example, 5V.

The magnetoresistance element (third magnetic sensor element) 26 has, for example, a resistance value of $R_5$. The magnetoresistance element (fourth magnetic sensor element) 27 has, for example, a resistance value of $R_6$. Another end of the magnetoresistance element 26 is electrically connected to one end of the magnetoresistance element 27. Another end of the magnetoresistance element 27 is electrically connected to another end of the magnetoresistance element 25, and simultaneously electrically connected to the GND terminal 11. Further, the MR sensor 2a is configured such that the resistance values $R_3$ to $R_6$ vary dependent on strength of a magnetic field. In addition, the magnetoresistance elements 24 to 27 are configured to, for example, have the same resistance value with each other in case that the detecting device 1 is situated in an initial state. Namely, the MR sensor 2a is configured, for example, such that in an initial state, a divided voltage $V_{12}$ as a first divided voltage of the magnetoresistance element 24 and the magnetoresistance element 25, and a divided voltage $V_{34}$ as a second divided voltage of the magnetoresistance element 26 and the magnetoresistance element 27 are equalized. The divided voltage $V_{12}$ and the divided voltage $V_{34}$ according to the embodiment are, as one example, 2.5 V. Further, the initial state means, for example, a state that an amplification signal obtained by differentially amplifying the divided voltage $V_{12}$ and the divided voltage $V_{34}$ becomes zero.

The switch information 80 of the detecting device 1 according to the embodiment includes, for example, information on a third mode configured to detect an abnormality of the MR sensor 2a in addition to the first and second modes in the first embodiment. The third mode includes, for example, as shown in Table 1 below, a first phase and a second phase.

TABLE 1

|  | Switch 50 | Switch 51 | Switch 52 | Switch 53 | Switch 54 |
|---|---|---|---|---|---|
| First phase | On | Off | Off | On | On |
| Second phase | Off | On | On | Off | On |

The first phase is configured to detect an abnormality of the magnetoresistance element 24 or the magnetoresistance element 25 of the MR sensor 2a. The second phase is configured to detect an abnormality of the magnetoresistance element 26 or the magnetoresistance element 27 of the MR sensor 2a.

The first phase is configured to, for example, as shown in Table 1, allow the switch 50 to be the on-state, the switch 51 to be the off-state, the switch 52 to be the off-state, the switch 53 to be the on-state, and the switch 54 to be the on-state. Consequently, to an inverting input terminal (−) of the operational amplifier 30 of the amplifying part 3, the divided voltage $V_{12}$ is input, and to a non-inverting input terminal (+), the reference voltage $V_2$ output from the reference voltage supply part 4 is input.

The second phase is configured to, for example, as shown in Table 1, allow the switch 50 to be the off-state, the switch 51 to be the on-state, the switch 52 to be the on-state, the switch 53 to be the off-state, and the switch 54 to be the on-state. Consequently, to an inverting input terminal (−) of the operational amplifier 30 of the amplifying part 3, the reference voltage $V_1$ output from the reference voltage supply part 4 is input, and to a non-inverting input terminal (+), the divided voltage $V_{34}$ is input. Further, the third mode is configured to, for example, be executed subsequently to the first mode, and further the second phase is executed subsequently to the first phase.

When the detecting device 1 is situated in the third mode, the reference voltage supply part 4 generates, as one example, the reference voltage $V_1$ and the reference voltage $V_2$ of 2.5 V. This is due to the fact that if the detecting device 1 is situated in the initial state, the divided voltage $V_{12}$ and the divided voltage $V_{34}$ is, for example, 2.5 V in case that the MR sensor 2a functions normally.

The comparing part 6 is configured to, as one example, in the first phase, compare the amplification voltage $V_3$ obtained by differentially amplifying the divided voltage $V_{12}$ and the reference voltage $V_2$, and a predetermined amplification voltage obtained by being differentially amplified based on the output of the MR sensor 2a situated in the initial state, with a predetermined amplification factor in the amplifying part 3. In the first phase, the comparing part 6 outputs, for example, when the amplification voltage $V_3$ is other than 0 V, a comparison signal showing that an abnormality of the magnetoresistance element 24 or the magnetoresistance element 25 is detected.

In addition, the comparing part 6 is configured to, as one example, in the second phase, compare the amplification voltage $V_3$ obtained by differentially amplifying the reference voltage $V_1$ and the divided voltage $V_{34}$, and a predetermined amplification voltage obtained by being differentially amplified based on the output of the MR sensor 2a situated in the initial state, with a predetermined amplification factor in the amplifying part 3. In the second phase, the comparing part 6 outputs, for example, when the amplification voltage $V_3$ is other than 0 V, a comparison signal showing that an abnormality of the magnetoresistance element 26 or the magnetoresistance element 27 is detected.

The operation of the detecting device 1 according to the second embodiment will be explained below.

<Operation of Detecting Device 1>

First, when a crew member applies the main power of vehicles, a control signal is input form the control terminal 13.

The control part 7 switches the switching part 5 in response to the first mode based on the control signal input, so as to allow the reference voltage supply part 4, the amplifying part 3 and the comparing part 6 to be electrically connected with each other.

Next, the reference voltage supply part 4 supplies the reference voltage $V_1$ and the reference voltage $V_2$ to the amplifying part 3.

Next, the amplifying part 3 outputs the amplification voltage $V_3$ obtained by differentially amplifying the reference voltage $V_1$ and the reference voltage $V_2$ input, to the comparing part 6 via the switch 54.

Next, the comparing part 6 compares an amplification voltage obtained by differentially amplifying the reference voltage $V_1$ and the reference voltage $V_2$ with a predetermined amplification factor to the amplification voltage $V_3$ actually output.

Next, the comparing part 6 outputs the comparison result as a comparison signal.

Next, the control part 7 of the detecting device 1 executes the third mode based on the comparison signal obtained, if an abnormal of the amplification factor of the amplifying part 3 is not detected in the first mode.

The control part 7 switches the switching part 5 in response to the first phase of the third mode so as to allow the magnetoresistance elements 24 and 25 and the amplifying part 3, the reference voltage supply part 4 and the amplifying part 3, and the amplifying part 3 and the comparing part 6 to be electrically connected with each other.

Next, the reference voltage supply part 4 supplies the reference voltage $V_2$ to the amplifying part 3.

Next, the amplifying part 3 outputs the amplification voltage $V_3$ obtained by differentially amplifying the divided voltage $V_{12}$ output from the MR sensor 2a and the reference voltage $V_2$ output from the reference voltage supply part 4, to the comparing part 6 via the switch 54.

Next, the comparing part 6 compares an amplification voltage obtained by differentially amplifying the divided voltage $V_{12}$ and the reference voltage $V_2$ with a predetermined amplification factor, to the amplification voltage $V_3$ actually output.

Next, the control part 7 executes the second phase subsequently, if an abnormality is not detected based on the comparison result. Further, if the abnormality is detected, the comparing part 6 outputs a comparison signal showing an abnormality of the MR sensor 2a.

Next, the control part 7 switches the switching part 5 in response to the second phase of the third mode so as to allow the magnetoresistance elements 26 and 27 and the amplifying part 3, the reference voltage supply part 4 and the amplifying part 3, and the amplifying part 3 and the comparing part 6 to be electrically connected with each other.

Next, the reference voltage supply part 4 supplies the reference voltage $V_1$ to the amplifying part 3.

Next, the amplifying part 3 outputs the amplification voltage $V_3$ obtained by differentially amplifying the reference voltage $V_1$ output from the reference voltage supply part 4 and the divided voltage $V_{34}$ output from the MR sensor 2a, to the comparing part 6 via the switch 54.

Next, the comparing part 6 compares an amplification voltage obtained by differentially amplifying the reference voltage $V_1$ and the divided voltage $V_{34}$ with a predetermined amplification factor, to the amplification voltage $V_3$ actually output.

Next, the control part 7 executes the second phase subsequently, if an abnormality is not detected based on the comparison result. Further, if the abnormality is detected, the comparing part 6 outputs a comparison signal showing an abnormality of the MR sensor 2a.

Advantages of Second Embodiment

In accordance with the detecting device 1 according to the second embodiment, an abnormality of the MR sensor 2a can be detected. In addition, according to the detecting device 1, the reference voltage $V_1$ and the reference voltage $V_2$ corresponding to the divided voltage $V_{12}$ and the divided voltage $V_{34}$ in an initial state can be supplied to the amplifying part 3 by the reference voltage supply part 4, thus the detection of abnormality can be more precisely executed, in comparison with a case that the detection is executed based on an output from the Hall sensor.

Third Embodiment

The third embodiment is different from the above-mentioned embodiments in using the detecting device 1 according to the first embodiment as a current sensor.

Figure 3A:
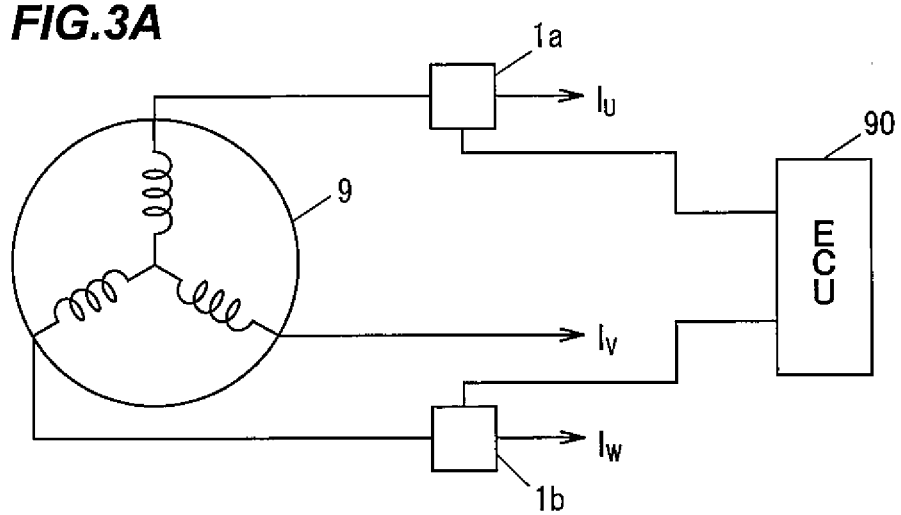
FIG. 3A is an explanatory view schematically showing a relationship between a current sensor according to a third embodiment and a three phase motor.
Figure 3B:
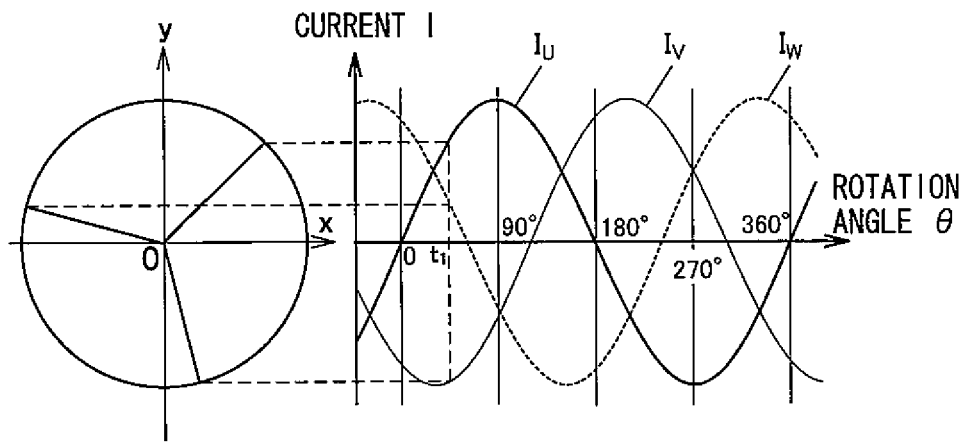
FIG. 3B is an explanatory view schematically showing a relationship between three currents and a rotation angle of the three phase motor.
Figure 3C:
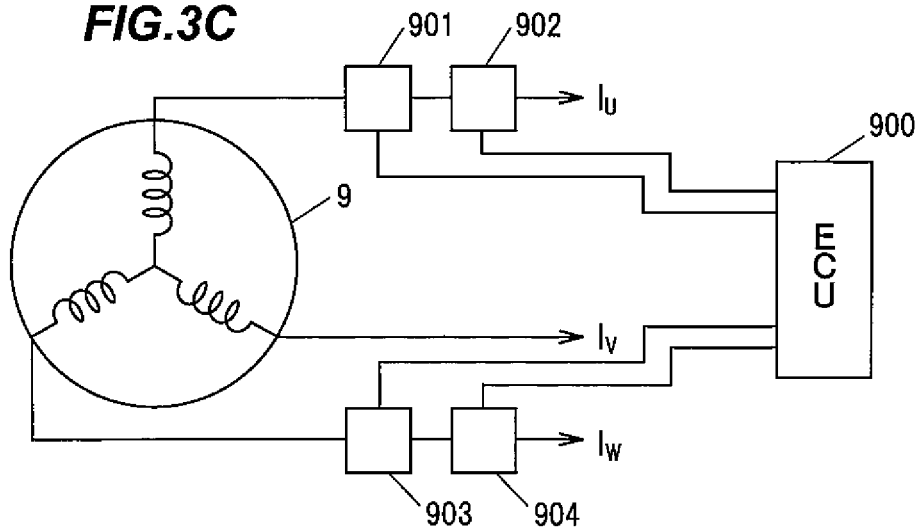
FIG. 3C is an explanatory view schematically showing a relationship between a current sensor according to Comparative Example 1 and a three phase motor.
Figure 3D:
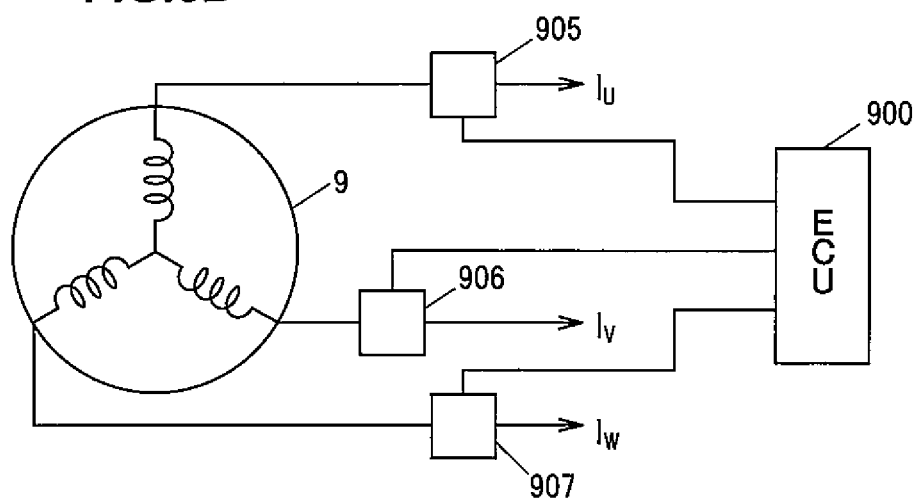
FIG. 3D is an explanatory view schematically showing a relationship between a current sensor according to Comparative Example 2 and a three phase motor.

FIG. 3A is an explanatory view schematically showing a relationship between a current sensor according to the third embodiment and a three phase motor, FIG. 3B is an explanatory view schematically showing a relationship between three currents and a rotation angle of the three phase motor, FIG. 3C is an explanatory view schematically showing a relationship between a current sensor according to Comparative Example 1 and a three phase motor, and FIG. 3D is an explanatory view schematically showing a relationship between a current sensor according to Comparative Example 2 and a three phase motor. An x-y coordinate that is a left drawing shown in FIG. 3B has its origin at the rotation center of a three-phase motor 9. A right drawing shown in FIG. 3B shows a relationship between current I (vertical axis) and rotation angle theta (horizontal axis).

The current sensor 1a is disposed on, for example, as shown in FIG. 3A, a power-supply line of a U phase of the three-phase motor 9. In addition, the current sensor 1b is disposed on, for example, as shown in FIG. 3A, a power-supply line of a W phase of the three-phase motor 9. The current sensor 1a and the current sensor 1b have the same configuration as that of the detecting device 1 according to the first embodiment.

The three-phase motor 9, for example, as shown in FIG. 3B, is used for a driving source of hybrid vehicles, and a current $I_U$ of a U phase, a current $I_V$ of a V phase and a current $I_W$ of a W phase that have respectively a phase different from each other by 120 degrees flow through the three-phase motor 9.

The current sensor 1a and the current sensor 1b are configured to detect a current that flows through the three-phase motor 9. Further, the current sensor 1a and the current sensor 1b according to the embodiment do not execute a detection of the current $I_V$ for the following reason. As shown in FIG. 3B, the current $I_U$, the current $I_V$ and the current $I_W$ have respectively a phase different from each other by 120 degrees, and the sum of the three currents at the rotation angle theta of the time $t_1$ of the three-phase motor 9 becomes zero. Consequently, if at least two currents of the tree current $I_U$, $I_V$ and $I_W$ are detected, a value of the remaining current can be calculated therefrom, thus a detection of the currents that flow through the three-phase motor 9 can be executed by detecting at least two currents of the tree current $I_U$, $I_V$ and $I_W$.

The current sensor 1a and the current sensor 1b, for example, output a detection signal to the Electronic Control Unit (ECU) 90 mounted on vehicles.

The ECU 90 is configured to, for example, calculate a value of the current $I_V$ based on the two detection signals output from the current sensor 1a and the current sensor 1b, so as to judge whether the currents are properly supplied to the three-phase motor 9 or not. In addition, the ECU 90 is configured to, for example, execute diagnosis for failure such as sensitivity misalignment of the current sensor 1a and the current sensor 1b based on the two comparison signals output from the current sensor 1a and the current sensor 1b after a power-supply of vehicles is applied.

On the other hand, Comparative Example 1 shown in FIG. 3C is configured to include current sensors 901 and 902 disposed on the power-supply line of the U phase, and current sensors 903 and 904 disposed on the power-supply line of the W phase. Each of the current sensors 901 to 904 is a well-known current sensor.

On the assumption that any one of the current sensors 901 to 904 fails to operate properly, Comparative Example 1 has a configuration that two current sensors are disposed on one power-supply line, so as to have redundancy.

In addition, Comparative Example 2 shown in FIG. 3D is configured to include the current sensor 905 disposed on the power-supply line of the U phase, the current sensor 906 disposed on the power-supply line of the V phase and the current sensor 907 disposed on the power-supply line of the W phase. Each of the current sensors 905 to 907 is a well-known current sensor.

In case of Comparative Example 2, from any two current values of the U, V and W phases, the remaining current value can be calculated, thus on the assumption that any one of the current sensors 905 to 907 fails to operate properly, Comparative Example 2 has a configuration that one of the current sensors is disposed on each of the power-supply lines, so as to have redundancy.

However, in case that the detecting device 1 according to the first embodiment is used for the current sensor, diagnosis for failure such as sensitivity misalignment is executed by using an application of power-supply as a trigger, consequently the fact eliminates the need for the detecting device having redundancy, so that the number of the current sensor can be reduced in comparison with Comparative Examples 1 and 2.

Advantages of Third Embodiment

In accordance with the current sensor according to the third embodiment, a comparative signal that is capable of determining failures such as a sensitivity misalignment of the Hall sensor and the amplifying part is output, consequently the number of current sensor to be disposed can be reduced, and production cost of an electronic device on which the current sensor according to the embodiment is mounted can be also reduced, in comparison with a detecting device that is not capable of determining failures of the Hall sensor and the amplifying part separately from each other.

Modifications of the above-mentioned embodiments will be explained below.

<Modification 1>

As the feedback resistance 32 of the amplifying part 3, for example, a variable resistance in which the resistance value can be varied by an operation from outside can be used.

<Modification 2>

As the feedback resistance 32 of the amplifying part 3, for example, a configuration can be used that includes a plurality of resistances and a plurality of switches having the same number as the plurality of resistances, such that the amplification factor of the amplifying part 3 can be changed by shifting the switches.

<Modification 3>

The detecting device 1 can include a judging part configured to judge an abnormality of the detecting part and the amplifying part 3 based on a comparison signal output from the comparing part 6.

<Modification 4>

As the detecting part of the detecting device 1, for example, an acceleration sensor or the like configured to detect a change in an electrical capacity can be also used.

<Modification 5>

In the above-mentioned third embodiment, the current sensor 1a and the current sensor 1b are respectively configured to, as one example, be used as a current sensor detecting a current of a three phase motor, but they are not limited to this, they can be also used as a current sensor detecting a current of the other electronic device.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth. In particular, it should be noted that all of the combinations of features as described in the embodiment and modifications are not always needed to solve the problem of the invention.

REFERENCE SIGNS LIST

1 Detecting Device
1a, 1b Current Sensor
2 Hall Sensor
2a MR Sensor
3 Amplifying Part
4 Reference Voltage Supply Part
5 Switching Part
6 Comparing Part
7 Control Part
8 Memory
10 Input Terminal
11 GND Terminal
12 Output Terminal
13 Control Terminal
20-23 Terminal
24-27 Magnetoresistance Element
30 Operational Amplifier
31 Input Resistance
32 Feedback Resistance
50-54 Switch
80 Switch Information
90, 900 ECU
901-907 Current Sensor

The invention claimed is:

1. A detecting device, comprising:
a detecting part configured to detect a change in an object to be detected so as to output a detection signal;
an amplifying part configured to amplify the detection signal output from the detecting part so as to output a first amplification signal;
a reference voltage supply part configured to supply a reference voltage to the amplifying part, the reference voltage being input to the amplifying part so as to be output as a second amplification signal;
a switching part configured to switch a connection between the detecting part and the amplifying part or a connection between the amplifying part and the reference voltage supply part based on a control signal input thereto; and
a comparing part configured to compare a predetermined amplification factor in the amplifying part, with an amplification factor obtained from the second amplification signal so as to output the comparison result as a comparison signal,
wherein the detecting part comprises a magnetic sensor,
wherein the magnetic sensor comprises a bridge circuit comprising a first magnetic sensor element to a fourth magnetic sensor element, and the reference voltage supply part generates a first reference voltage corresponding to a first divided voltage of the first magnetic sensor element and the second magnetic sensor element, and a second reference voltage corresponding to a second divided voltage of the third magnetic sensor element and the fourth magnetic sensor element in an initial state, and
wherein the comparing part is configured to compare a third amplification signal obtained by differentially amplifying the first divided voltage and the second divided voltage by the amplifying part, with a fourth amplification signal obtained by differentially amplifying the first divided voltage and the second reference voltage by the amplifying part so as to output the comparison signal.

2. A current sensor, comprising the detecting device according to claim 1.

3. The current sensor according to claim 2, wherein the current sensor is connected to at least two phases of a three phase motor.

4. The detecting device according to claim 1, wherein the predetermined amplification factor is variable.

5. The detecting device according to claim 1, further comprising a judging part configured to judge an abnormality of the detecting part and the amplifying part based on the comparison signal output from the comparing part.

6. The detecting device according to claim 1, wherein the detecting part comprises an acceleration sensor configured to detect a change in an electrical capacity.

7. A detecting device, comprising:
a detecting part configured to detect a change in an object to be detected so as to output a detection signal;
an amplifying part configured to amplify the detection signal output from the detecting part so as to output a first amplification signal;
a reference voltage supply part configured to supply a reference voltage to the amplifying part, the reference voltage being input to the amplifying part so as to be output as a second amplification signal;
a switching part configured to switch a connection between the detecting part and the amplifying part or a connection between the amplifying part and the reference voltage supply part based on a control signal input thereto; and a comparing part configured to compare a predetermined amplification factor in the amplifying part, with an amplification factor obtained from the second amplification signal so as to output the comparison result as a comparison signal, wherein the detecting part comprises a magnetic sensor, wherein the magnetic sensor comprises a bridge circuit comprising a first magnetic sensor element to a fourth magnetic sensor element, and the reference voltage supply part generates a first reference voltage corresponding to a first divided voltage of the first magnetic sensor element and the second magnetic sensor element, and a second reference voltage corresponding to a second divided voltage of the third magnetic sensor element and the fourth magnetic sensor element in an initial state, and wherein the comparing part is configured to compare a third amplification signal obtained by differentially amplifying the first divided voltage and the second divided voltage by the amplifying part, with a fifth amplification signal obtained by differentially amplifying the first reference voltage and the second divided voltage by the amplifying part so as to output the comparison signal.

8. The detecting device according to claim 7, wherein the predetermined amplification factor is variable.

9. The detecting device according to claim 7, further comprising a judging part configured to judge an abnormality of the detecting part and the amplifying part based on the comparison signal output from the comparing part.

10. The detecting device according to claim 7, wherein the detecting part comprises an acceleration sensor configured to detect a change in an electrical capacity.

11. A current sensor, comprising the detecting device according to claim 7.

12. The current sensor according to claim 11, wherein the current sensor is connected to at least two phases of a three phase motor.

* * * * *